United States Patent
Song et al.

(10) Patent No.: US 7,955,924 B2
(45) Date of Patent: Jun. 7, 2011

(54) IMAGE SENSOR AND METHOD OF MANUFACTURING THE SAME

(75) Inventors: Jae-ho Song, Suwon-si (KR); Chan Park, Yongin-si (KR); Young-hoon Park, Suwon-si (KR); Sang-il Jung, Seoul (KR); Jong-wook Hong, Seoul (KR); Keo-sung Park, Seoul (KR); Eun-soo Kim, Seongnam-si (KR); Won-je Park, Suwon-si (KR); Jin-Hyeong Park, Seoul (KR); Dae-cheol Seong, Seoul (KR); Won-jeong Lee, Seongnam-si (KR); Pu-ra Kim, Gwangju Metropolitan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 293 days.

(21) Appl. No.: 11/651,542

(22) Filed: Jan. 10, 2007

(65) Prior Publication Data
US 2007/0161140 A1 Jul. 12, 2007

(30) Foreign Application Priority Data
Jan. 12, 2006 (KR) .................. 10-2006-0003604

(51) Int. Cl.
*H01L 21/8238* (2006.01)
(52) U.S. Cl. ............... 438/228; 257/222; 257/E33.076; 438/142
(58) Field of Classification Search ............. 438/228, 438/142; 257/E33.076, 222
See application file for complete search history.

(56) References Cited

U.S. PATENT DOCUMENTS

| | | | | |
|---|---|---|---|---|
| 5,556,801 | A | * | 9/1996 | Hawkins et al. ............. 438/144 |
| 2001/0001072 | A1 | * | 5/2001 | Hirano ........................ 438/154 |
| 2002/0072156 | A1 | * | 6/2002 | Lee et al. .................... 438/151 |
| 2004/0129990 | A1 | * | 7/2004 | Lee ............................. 257/428 |
| 2007/0007611 | A1 | * | 1/2007 | Park et al. ................... 257/431 |

FOREIGN PATENT DOCUMENTS

| | | |
|---|---|---|
| JP | 2003-101004 | 4/2003 |
| KR | 10-2004-00360-86 | 4/2004 |
| KR | 10-2004-0036086 A | 4/2004 |
| KR | 10-2004-0093295 | 11/2004 |
| KR | 10-2005-0040360 | 5/2005 |

OTHER PUBLICATIONS

Korean Notice of Allowance dated Jan. 3, 2008.
Korean Office Action dated Jan. 16, 2007.

* cited by examiner

*Primary Examiner* — Thao X Le
*Assistant Examiner* — Matthew Gordon
(74) *Attorney, Agent, or Firm* — Harness, Dickey & Pierce, PLC

(57) ABSTRACT

Example embodiments disclose an image sensor capable of preventing or reducing image lag and a method of manufacturing the same. Example methods may include forming a gate insulating film and a gate conductive film doped with a first-conductive-type dopant on a semiconductor substrate; forming a transfer gate pattern by patterning the gate insulating film and the gate conductive film; and fabricating a transfer gate electrode by forming a first-conductive-type photodiode in the semiconductor substrate adjacent to one region of the transfer gate pattern, by forming a second-conductive-type photodiode on the first-conductive-type photodiode, and by forming a first-conductive-type floating diffusion region in the semiconductor substrate adjacent to the other region of the transfer gate pattern.

10 Claims, 6 Drawing Sheets

IMAGE SENSOR AND METHOD OF MANUFACTURING THE SAME

PRIORITY STATEMENT

This application claims priority from Korean Patent Application No. 10-2006-0003604 filed on Jan. 12, 2006 in the Korean Intellectual Property Office, the disclosure of which is incorporated herein by reference in its entirety.

BACKGROUND

1. Field

Example embodiments described herein relate to an image sensor and a method of manufacturing the same, and, for example, to an image sensor capable of reducing image lag and a method of manufacturing the same.

2. Description of the Related Art

In general, image sensors are semiconductor elements that convert an optical image into an electrical signal. Image sensors can be divided into CCDs (charge coupled devices) and CMOS image sensors.

A CCD is an element in which MOS capacitors may be packed closely and accumulate or transfer charge carriers. A CMOS image sensor may be made to have the same number of MOS transistors as pixels by a CMOS technique using a control circuit and a signal processing circuit as peripheral circuits and using a switching method of sequentially detecting output by using the MOS transistors.

A CMOS image sensor may be generally divided into an APS (active pixel sensor) region, a reset region, a source follower region, and/or a peripheral circuit region. A photodiode and/or a floating diffusion region may be located on both sides of a transfer gate electrode included in the APS region. The transfer gate electrode may transfer photocharge accumulated in the photodiode to the floating diffusion region.

When such an APS region is formed, n– ions may be implanted into a region of the transfer gate electrode adjacent to the photodiode at low concentration. Then, a PPD (pinned photodiode) may be formed on a surface of the photodiode so as to reduce dark current. At that time, a p– dopant may be implanted into the region of the transfer gate adjacent to the photodiode. Thus, the concentration of n– dopant implanted into the region of the transfer gate electrode adjacent to the photodiode may be lowered.

When the floating diffusion region is formed, an n+ dopant may be implanted into a region of the transfer gate electrode adjacent to the floating diffusion region in higher concentrations. Thus, the dopant may be implanted into regions of the transfer gate at varying concentrations.

These varying concentrations may cause Fermi level difference. As a result, the transfer gate may act as a barrier when photocharge generated in the photodiode are transferred to the floating diffusion region. Thus the photocharge may not be completely transferred from the photodiode to the floating diffusion region, resulting in image lag.

SUMMARY

Example embodiments provide an image sensor capable of reducing image lag.

Example embodiments also provide a method of manufacturing an image sensor capable of reducing image lag.

Example embodiments are not limited to those mentioned herein, and other example embodiments will be readily understood by those skilled in the art through the following description.

According to example embodiments, a method of manufacturing an image sensor may include forming a gate insulating film and/or a gate conductive film doped with a first-conductive-type dopant on a semiconductor substrate; forming a transfer gate pattern by patterning the gate insulating film and/or the gate conductive film; and completing a transfer gate electrode by forming a first-conductive-type photodiode in the semiconductor substrate adjacent to one region of the transfer gate pattern, by forming a second-conductive-type photodiode on the first-conductive-type photodiode, and by forming a first-conductive-type floating diffusion region in the semiconductor substrate adjacent to the other region of the transfer gate pattern.

According to example embodiments, a method of manufacturing an image sensor may include forming a gate insulating film and/or an undoped gate conductive film on a semiconductor substrate; doping the gate conductive film with a first-conductive-type dopant; forming a transfer gate pattern by patterning the gate insulating film and/or the gate conductive film; forming a first mask that exposes one region of the transfer gate pattern and/or a top surface of the semiconductor substrate adjacent to the one region of the transfer gate pattern; forming a first-conductive-type photodiode in the semiconductor substrate by implanting the first-conductive-type dopant by using the first mask as an ion implantation mask; forming a second-conductive-type photodiode by implanting a second-conductive-type dopant into the exposed one region of the transfer gate pattern and/or a surface of the first-conductive-type photodiode adjacent to the exposed one region of the transfer gate pattern by using the first mask as an ion implantation mask; removing the first mask; forming a second mask that exposes the other region of the transfer gate pattern and/or the top surface of the semiconductor substrate adjacent to the other region of the transfer gate pattern; and/or forming a first-conductive-type floating diffusion region in the semiconductor substrate adjacent to the other region of the transfer gate pattern by using the second mask as an ion implantation mask.

According to an example embodiment, an image sensor may include a semiconductor substrate; a photodiode including a first-conductive-type photodiode formed in the semiconductor substrate and a second-conductive-type photodiode formed on the first-conductive-type photodiode and accumulating photocharge; a first-conductive-type floating diffusion region receiving and detecting the photocharge accumulated in the photodiode; and/or a transfer gate electrode transferring the photocharge accumulated in the photodiode to the floating diffusion region. In the image sensor, a region of the transfer gate electrode may be adjacent to the photodiode and may include a mixture of a first-conductive-type dopant and/or a second-conductive-type dopant implanted thereinto, the concentration of the first-conductive-type dopant being higher than that of the second-conductive-type dopant. In addition, the other region of the transfer gate electrode adjacent to the floating diffusion region may include the first-conductive-type dopant implanted thereinto.

BRIEF DESCRIPTION OF THE DRAWINGS

The above and other features and advantages of example embodiments will become more apparent by describing in detail example embodiments thereof with reference to the attached drawings, in which.

DETAILED DESCRIPTION

Figure 1:
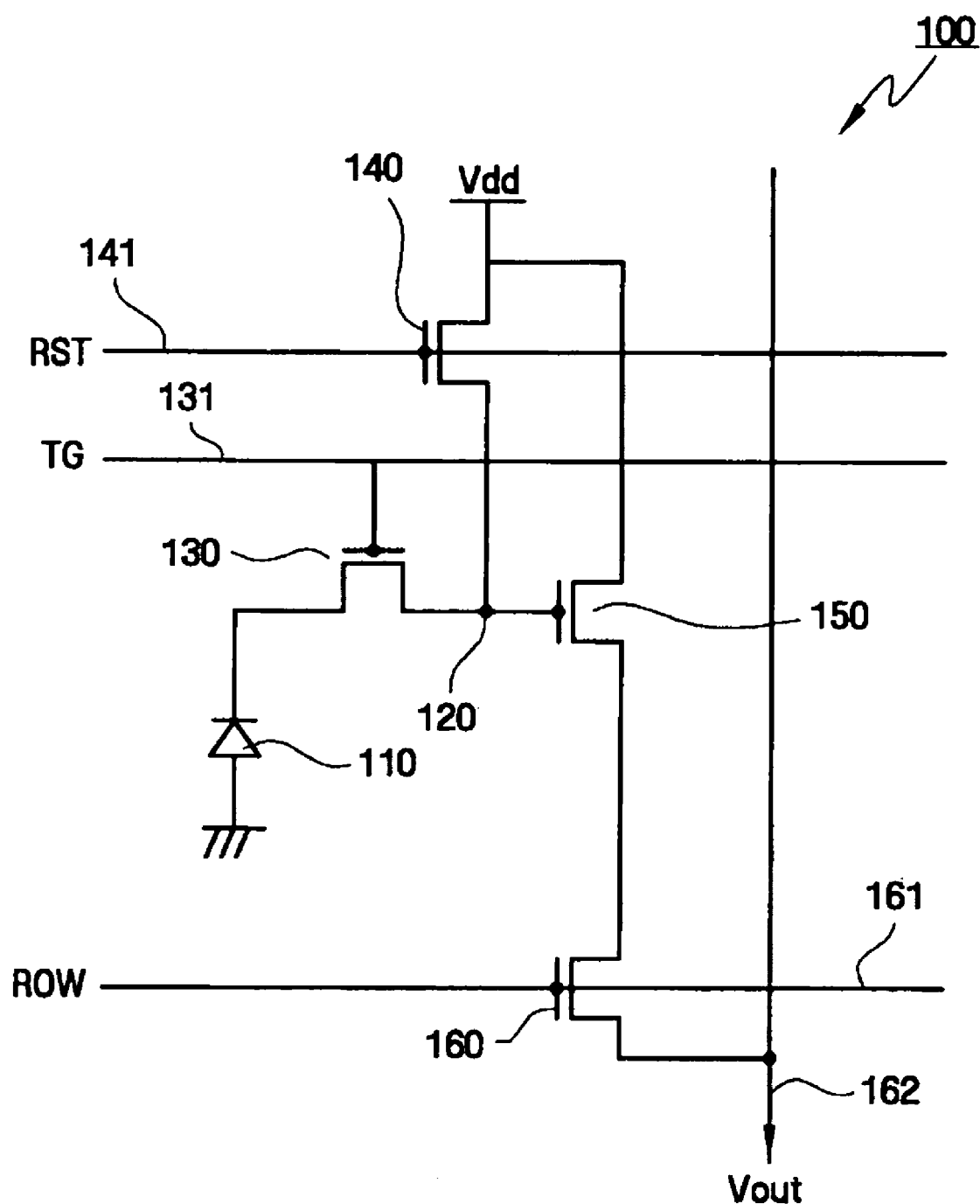
FIG. 1 is a circuit diagram of a unit pixel of an image sensor according to an example embodiment.

Various example embodiments will now be described more fully with reference to the accompanying drawings in which some example embodiments are shown. In the drawings, the thicknesses of layers and regions are exaggerated for clarity.

Detailed example embodiments are disclosed herein. However, specific structural and/or functional details disclosed herein are merely representative for purposes of describing example embodiments. This disclosure may, however, may be embodied in many alternate forms and should not be construed as limited to only example embodiments set forth herein.

Accordingly, while example embodiments are capable of various modifications and alternative forms, example embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing example embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

An example embodiment of an image sensor is described in detail with reference to FIGS. 1 and 3. In example embodiments, a CMOS image sensor is described as an example of an image sensor. However, it should be appreciated that the technical idea of example embodiments may also be applied to a CCD (charge coupled device) or similar device.

Figure 2:
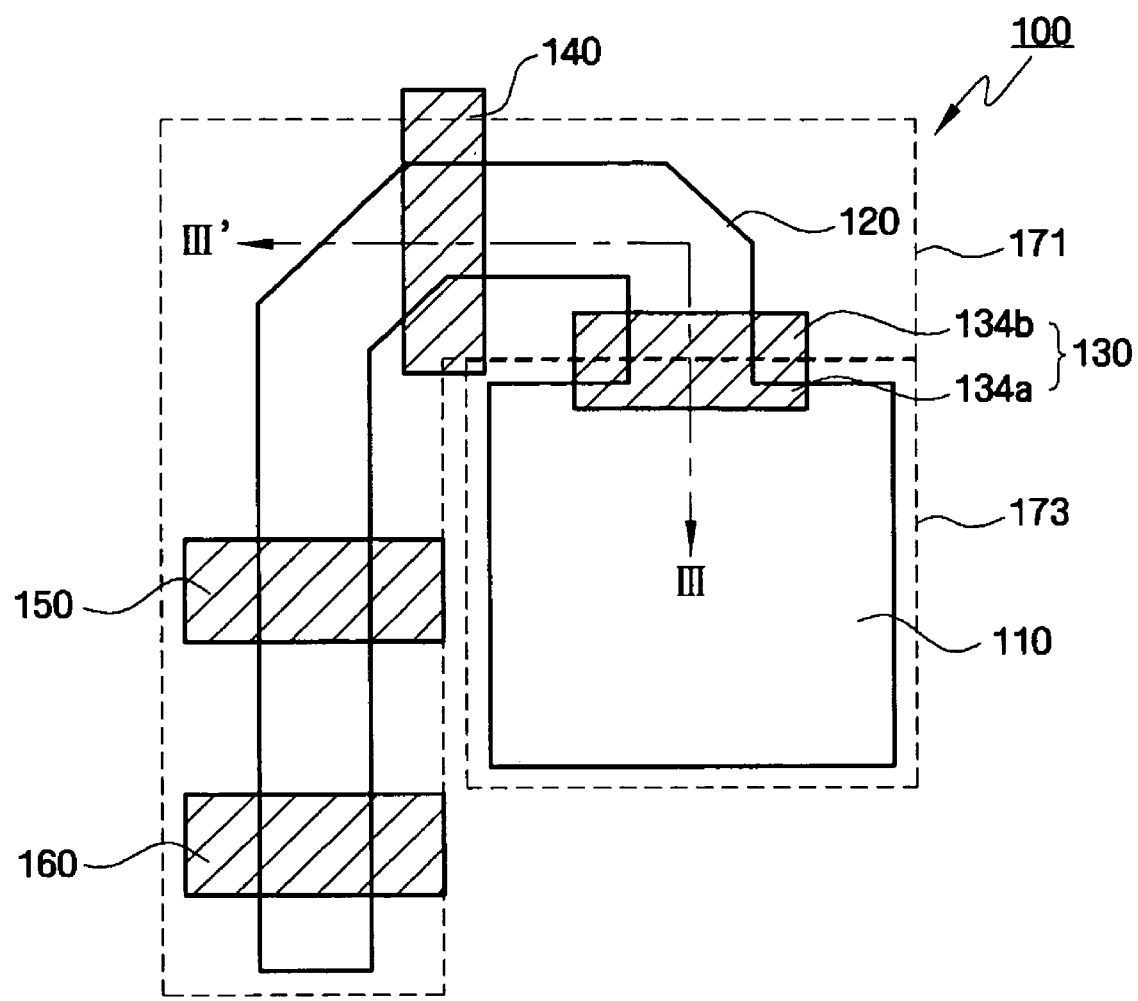
FIG. 2 is a schematic plan view of the unit pixel of the image sensor according to an example embodiment.

FIG. 1 is a circuit diagram of a unit pixel of an image sensor according to an example embodiment. FIG. 2 is a schematic plan view of a unit pixel of the image sensor according to an example embodiment.

As shown in FIGS. 1 and 2, a unit pixel 100 of an image sensor may include a photoelectric transducer 110, a charge detector 120, a charge transfer unit 130, a reset unit 140, an amplifier 150, and/or a selector 160. As shown in FIG. 1, the unit pixel 100 may include four or more transistors.

The photoelectric transducer 110 may generate charge corresponding to incident light and accumulates the charge therein. The photoelectric transducer 110 may be a photodiode, a photo transistor, a photo gate, a PPD (pinned photodiode), or a combination thereof.

As an example, a floating diffusion region (FD) may be used as the charge detector 120. The charge detector 120 may receive the charge accumulated in the photoelectric transducer 110. The charge detector 120 may have parasitic capacitance and thus may accumulate the charge. The charge detector 120 may be electrically connected to a gate of the amplifier 150 and may control the amplifier 150.

The charge transfer unit 130 may transfer charge from the photoelectric transducer 110 to the charge detector 120. The charge transfer unit 130 may be composed of, for example, one transistor that may be controlled by a charge transfer signal TG.

The reset unit 140 may periodically reset the charge detector 120. A charge source of the reset unit 140 may be connected to the charge detector 140, and a charge drain thereof may be connected to a power supply Vdd. The reset unit 140 may be driven in response to a reset signal RST.

The amplifier 150 may act as a source follower buffer amplifier with a constant current source (not shown) positioned outside the unit pixel 100 such that a voltage varying in response to the voltage of the charge detector 120 may be output to a vertical signal line 162. A charge source of the amplifier 150 may be connected to a charge drain of the selector 160 and a drain thereof is connected to the power supply Vdd.

The selector 160 may serve to select a row of unit pixels 100 to be read. The selector 160 may be driven in response to a selection signal, and a source of the selector 160 may be connected to the vertical signal line 162.

Driving signal lines 131, 141, and/or 161 of the charge transfer unit 130, the reset unit 140, and/or the selector 160 may extend in a row direction (shown as horizontal in FIG. 1) such that the unit pixels of the same row may be simultaneously driven.

Figure 3:
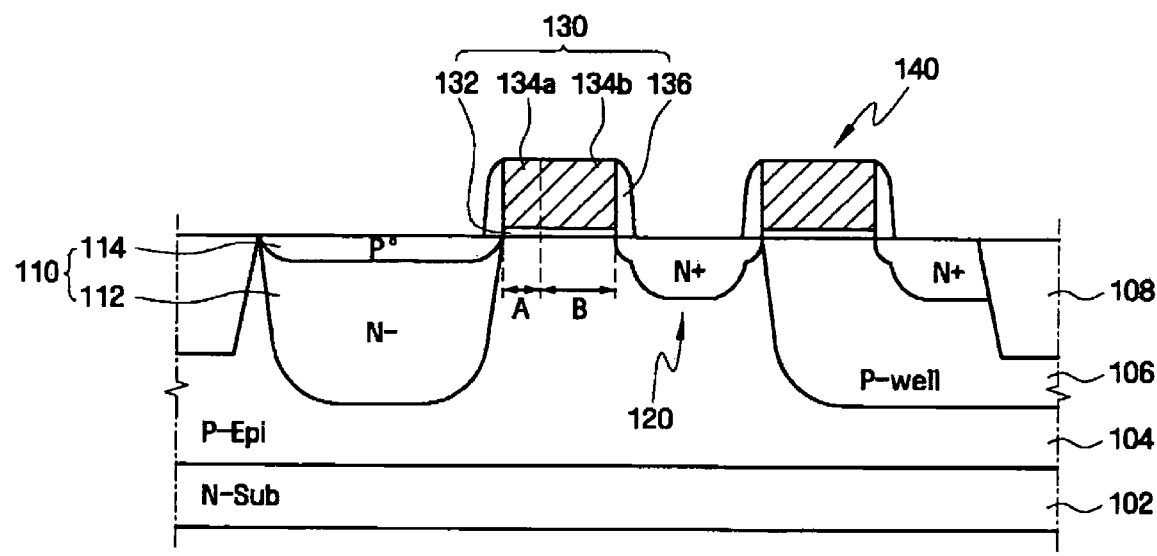
FIG. 3 is a cross-sectional view taken along the line III-III of FIG. 2.

FIG. 3 is a cross-sectional view taken along the line III-III of FIG. 2.

As shown in FIG. 3, the image sensor according to an example embodiment may include an n-type silicon substrate 102 and/or a p-type epitaxial layer 104. A pt-type epitaxial layer may be formed on the n-type silicon substrate 102. A p-well 106 and an n-well (not shown), potentially forming a PMOS and an NMOS, may be formed in the p-type epitaxial layer 104. In the p-type epitaxial layer 104, an element isolating film 108 may be formed to separate an active region from a field region.

The photodiode 110 may absorb optical energy, convert optical energy into photocharge, and/or accumulate a photocharge. The photodiode 110 may include an n-type photodiode 112 and a p-type photodiode 114 that may be formed by, for example, performing ion implantation twice. The n-type photodiode 112 may be formed lower in the p-type epitaxial layer 104, and the p-type photodiode 114 may be formed on or above the n-type photodiode 112. Therefore, the photodiode 110 may have a pnp junction structure in which the p-type epitaxial layer 104, the n-type photodiode 112, and the p-type photodiode 114 may be stacked. For example, the p-type photodiode 114 formed lower on the n-type photodiode 112 may reduce or prevent dark current from being generated due to surface damage in the n-type photodiode 112.

The photodiode 110 may transfer accumulated photocharge through the transfer gate electrode 130 to the n-type floating diffusion region 120 formed in the p-type epitaxial layer 104 so as to be separated from the photodiode 110. The n-type floating diffusion region 120 may be formed in an LDD (lightly doped drain) structure formed of a relatively lighter doped n-type dopant and a relatively heavier doped n-type dopant.

The transfer gate electrode 130 may be placed on the p-type epitaxial layer 104 between the photodiode 110 and the n-type floating diffusion region 120 and may transfer photocharge accumulated in the photodiode 110 to the n-type floating diffusion region 120.

An n-type dopant may be implanted into region 134a adjacent to the photodiode 110 before gate pattern formation and n-type and p-type dopants are implanted. The concentration of an n-type dopant implanted before gate pattern formation may be relatively larger, and it is possible to invert a p-type dopant contained in the part 134a (region A) of the transfer gate electrode 130.

A part 134b (region B) of the transfer gate electrode 130 adjacent to the n-type floating diffusion region 120 may include the n-type dopant doped before gate pattern formation and n-type dopants relatively lightly and heavily doped when an n-type floating diffusion region 120 with a LDD structure is formed.

In the transfer gate electrode 130, the concentration of a dopant in the region A may be relatively similar to that of the region B, thereby potentially reducing an image lag phenomenon due to a difference between concentrations of dopants in regions in the transfer gate electrode 130.

Now a method of manufacturing an image sensor according to an example embodiment is described with reference to FIGS. 3 through 8. FIGS. 3 through 8 are views showing an example method of manufacturing an image sensor along the line III-III of FIG. 2.

As shown in FIG. 3, an epitaxial layer 104 of a conductive type (for example, p-type or n-type) may be formed on a silicon substrate 102 of a differing conductive type.

A p− well 106 and an n− well (not shown) may be formed in the p-type epitaxial layer 104. An ion implantation mask defining a p− well forming region may be formed, and a p-type dopant, such as boron (B) or the like, may be implanted to form the p− well 106. The ion implantation mask may be removed and an ion implantation mask defining an n-well forming region may be formed. Implantation of an n-type dopant, such as phosphorus (P) or the like, may be performed to form an n− well.

Next, the element isolating film 108 may be formed by performing a LOCOS (local oxidation of silicon) process, an STI (shallow trench isolation) process, or a similarly suitable process to isolate a field region from a diffusion region.

Figure 4:
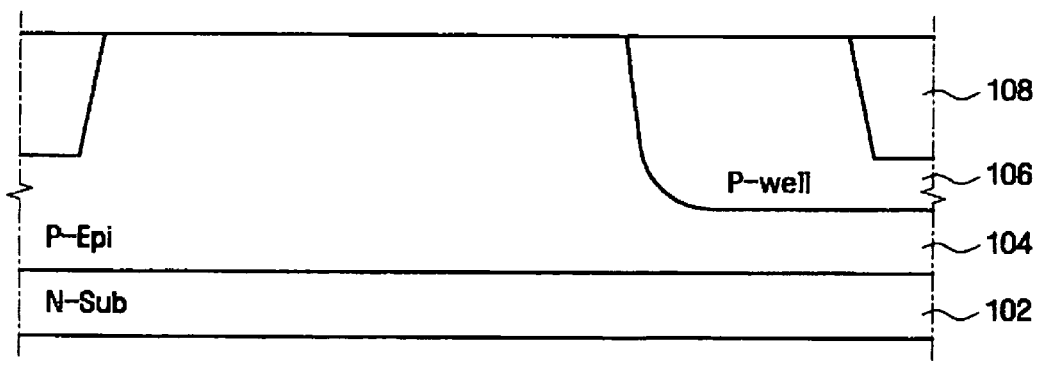
FIGS. 4 to 8 are views sequentially showing a method of manufacturing an image sensor according to an example embodiment.

As shown in FIG. 4, a gate insulating film 132 and an undoped gate conductive film may be sequentially laminated on the p-type epitaxial layer 104. The gate insulating film 132 may be formed of $SiO_2$, SiON, SiN, $Al_2O_3$, $Si_3N_4$, $Ge_xO_yN_z$, $Ge_xSi_yO_z$, and/or any high-dielectric material. The gate insulating film 132 may be formed of high-dielectric material, such as $HfO_2$, $ZrO_2$, $Al_2O_3$, $Ta_2O_5$, hafnium silicate, zirconium silicate, and/or a similar material, by atomic layer deposition or a similarly suitable process. The gate insulating film 132 may be formed, for example, in laminated layers of a combination of the above-mentioned materials. The gate insulating film 132 may be formed with a thickness of around 5 to 100 Å. An undoped gate conductive film may be composed of an undoped polysilicon film or similar material formed by deposition or similar process.

An undoped gate conductive film may be doped with an n-type dopant by an in-situ process, an ion implantation process, or a similar process to form the gate conductive film 134.

An n-type dopant may be implanted into an undoped gate conductive film with a concentration sufficient to invert a p-type dopant in a process of forming the p-type photodiode 114. For example, the n-type dopant may be around twice or more the concentration of a p-type dopant to form the gate conductive film 134.

Figure 5:
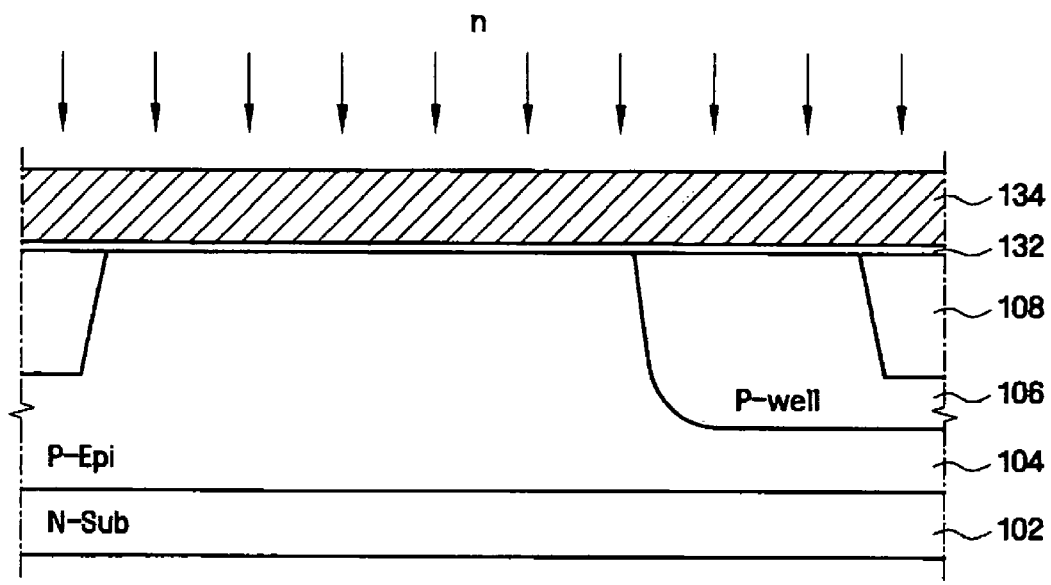
Figure 6:
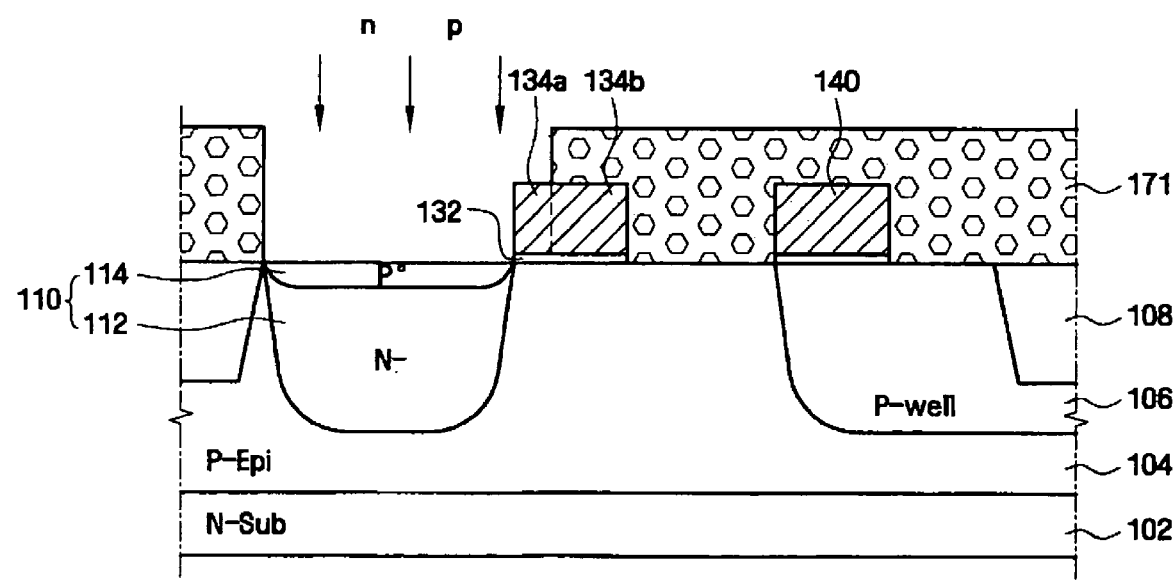

As shown in FIG. 5, the gate conductive film 134 and the gate insulating film 132 may be patterned to form gate patterns (see 130, 140, and 150 and 160 of FIG. 2). In FIG. 6, a mask 171 for forming a photodiode may be formed on a surface of a silicon substrate with gate patterns formed thereon. A mask 171 may be formed by coating a silicon substrate with photoresist and performing exposure and development on the photoresist, or by any other similarly suitable process. A first mask 171 may expose a section 134a of a transfer gate pattern and top surface of the p-type epitaxial layer 104 on a side of the part 134a (region A).

An n-type dopant may be implanted into the p-type epitaxial layer 104 by using the first mask 171 as an ion implantation mask to form an n-type photodiode 112. The n-type dopant may be implanted into the p-type epitaxial layer 104 with a dose of around 1.0E11 to 1.0E12 ions/cm$^2$. The n-type dopant may be implanted at a tilt of about 0° to 15° in a similar orientation to 134a of the transfer gate pattern. An n-type photodiode 112 may be formed to partially or completely overlap the section 134a of the transfer gate pattern.

A p-type dopant may be implanted into the p-type epitaxial layer 104 by reusing the first mask 171 as an ion implantation mask to form a p-type photodiode 114. The p-type dopant may be obliquely implanted into the n-type photodiode 112 with a dose of about 1.0E11 to 1.0E12 ions/cm$^2$ at a tilt of about 0° or more in a orientation similar to that of the element isolating film 108. The p-type photodiode 114 may be shallower than the n-type photodiode 112.

If a p-type photodiode 114 is formed in any of the above-mentioned ways, it may reduce EHPs (Electron-Hole pairs) thermally generated from a surface of the p-type epitaxial layer 104, thereby potentially preventing or reducing dark current. In an image sensor, for example, surface damage in the photodiode 110 may cause dark current. Surface damage may be caused by dangling silicon bonds or defects related to etching stress during manufacture. The n-type photodiode 112 may be formed deeper in the p-type epitaxial layer 104 than the p-type photodiode 114; thus positive charge of EHPs thermally generated from a surface of the p-type epitaxial layer 104 may diffuse to a ground substrate through the p-type photodiode 114, and/or negative charge thereof may be recombined with positive charge and/or be removed in a process of forming the p-type photodiode 114.

The part 134a (region A) of the transfer gate pattern may be exposed in a process of forming a photodiode 110 composed of n-type photodiode 112 and/or a p-type photodiode 114, and a n-type dopant and/or p-type dopant may also be implanted into an exposed part 134a of the transfer gate pattern.

Figure 7:
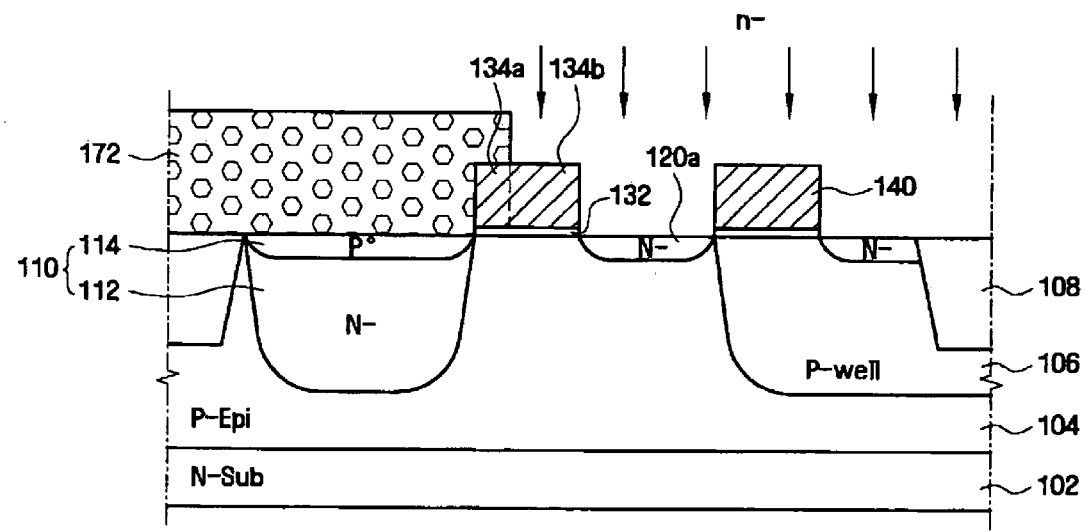

The first mask 171 may be removed, and photoresist application and development or another suitable process may be performed to form a second mask 172, which may be used to form the floating diffusion region 120, as shown in FIG. 7. The second mask 172 may expose the part 134b (region B) of the transfer gate pattern and/or top surface of the p-type epitaxial layer 104 on a side of the part 134b (region B).

The n-type dopant may be implanted at a relatively lower concentration using the second mask 172 to form a lightly doped n-type floating diffusion region 120a. An n-type dopant may be shallowly implanted at a relatively lower concentration into the p-type epitaxial layer 104, for example, with a dose of about $1.0E11$ to $1.0E12$ ions/cm$^2$. If an n-type dopant is implanted at a relatively lower concentration, an n-type dopant may also be implanted at a similar concentration into the part 134b (region B) of the transfer gate pattern exposed from the second mask 172.

Figure 8:
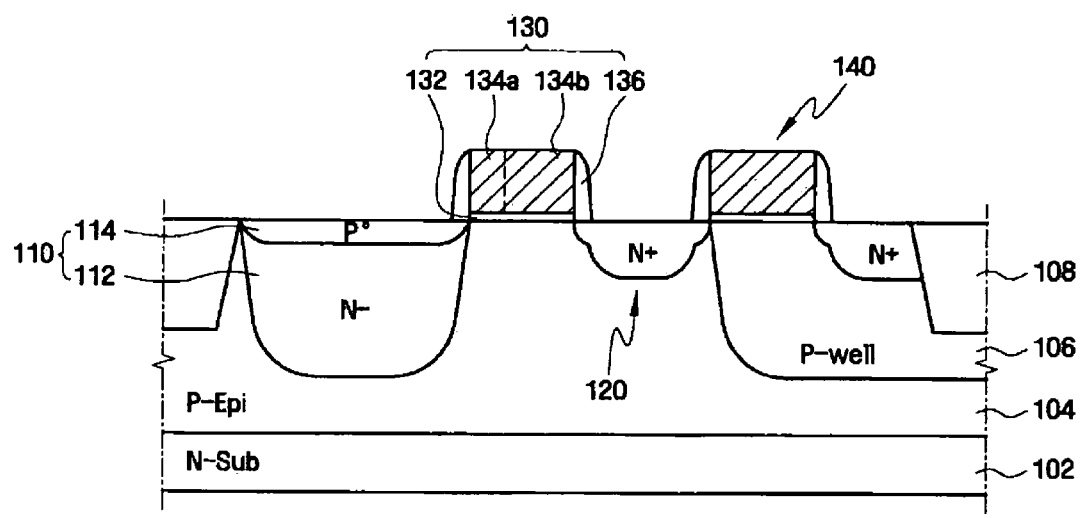

The second mask 172 may be removed, and an insulating film for gate spacers may be placed on the entire surface of the silicon substrate spacers 136. Then, anisotropic etching or another suitable process may be performed thereon to form spacers 136 on both sides of the gate pattern (see 130, 140, and 150 and 160 of FIG. 2), as shown in FIG. 8. A third mask 173 may be formed to partially or completely cover the photodiode i 10 and/or the part 134a (region A) of the transfer gate pattern adjacent to the photodiode 110, and an n-type dopant may be implanted at a relatively higher concentration by using the third mask 173, completing the n-type floating diffusion region 120 having an LDD structure. The n-type dopant may be implanted at a relatively higher concentration with a dose of, for example, about $1.0E14$ to $1.0E15$ ions/cm$^2$ and may also be implanted at a similar concentration into the part 134b (region B) of the transfer gate pattern exposed from the third mask 173.

The spacers 136 may be formed on both sides of the transfer gate patterns 134a and/or 134b, but other spacer arrangements are equally possible. For example, the spacers 136 may be formed only on a side of the part 134b (region B) of the transfer gate pattern by depositing an insulating film for a gate spacer, forming a mask to cover a top surface of the photodiode 110 and/or the part 134a (region A) of the transfer gate pattern, and performing anisotropic etching thereon by using the mask. The insulating film for gate spacers may be used to protect a photodiode.

The third mask 173 may be removed, thus completing an image sensor shown in FIG. 3. An image sensor may have a small difference between concentrations of dopants implanted into the regions of the transfer gate electrode 130.

An n-type dopant may be implanted into an undoped polysilicon film before the transfer gate patterns 134a and/or 134b are formed. Both the parts 134a and 134b (regions A and B) of a transfer gate pattern may include an n-type dopant implanted with a concentration of about $1.0E13$ to $1.0E14$ ions/cm$^2$.

If the photodiode 110 is formed, the part 134a (region A) of the transfer gate pattern may include an n-type dopant implanted with a concentration of about $1.0E11$ to $1.0E12$ ions/cm$^2$ and a p-type dopant implanted with a concentration of about $1.0E11$ to $1.0E12$ ions/cm$^2$. The part 134a (region A) of the transfer gate pattern may include an n-type dopant implanted with a concentration relatively larger than a concentration of a p-type dopant, and a p-type dopant may be changed to an n-type dopant in other example embodiments.

If the n-type photodiode 112 is formed, the part 134b (region B) of the transfer gate pattern may be doped at low concentration with an n-type dopant with a concentration of about $1.0E11$ to $1.0E12$ ions/cm$^2$ and may also be doped at relatively higher concentration with an n-type dopant with, for example, a concentration of about $1.0E14$ to $1.0E15$ ions/cm$^2$.

The dopant concentration difference between both the parts 134a and/or 134b of the transfer gate patterns may be further reduced.

Figure 9:
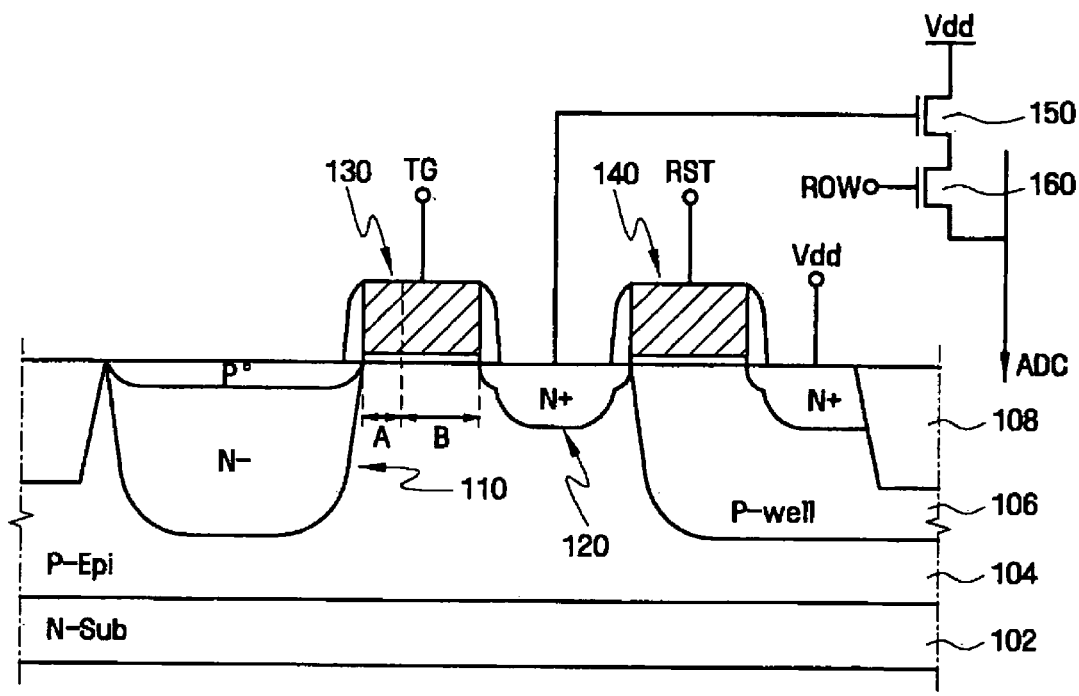
FIG. 9 is a conceptual view of an image sensor according to an example embodiment.
Figure 10:
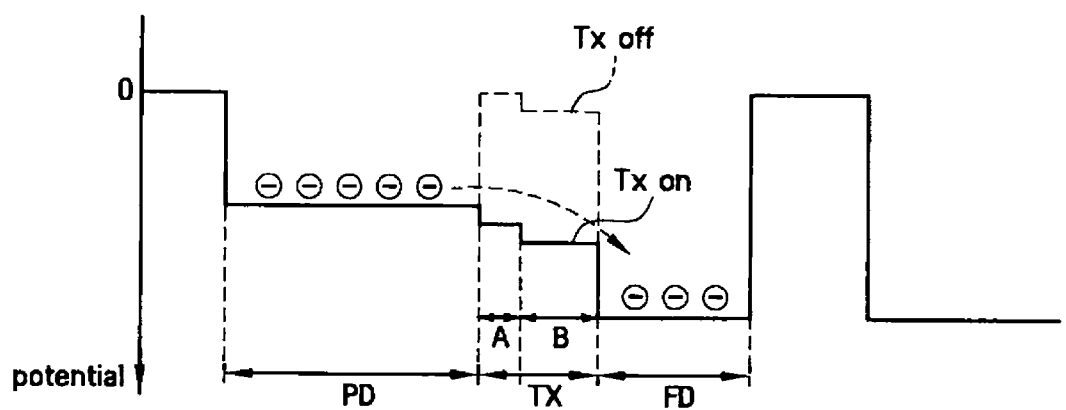
FIG. 10 is a view showing a potential profile of an image sensor according to an example embodiment.

As shown in FIGS. 9 and 10, an operation of an image sensor according to an example embodiment will be described. FIG. 9 is a conceptual view of an image sensor according to an example embodiment. FIG. 10 is a view showing a potential profile of an image sensor according to an example embodiment.

As shown in FIG. 9, a charge transfer signal TG may be input to the transfer gate electrode 130, and the n-type floating diffusion region 120 may be connected to a driver gate electrode of the amplifier 150. A reset signal RTS may be input to the reset gate electrode 140.

In an image sensor, if the transfer gate electrode 130 (TX) is in an off state, a potential profile of a lower region of the transfer gate electrode 130 (TX) may be relatively higher, and thus photocharge may be accumulated in the photodiode 110 (PD).

If the transfer gate electrode 130 (TX) is turned on, a potential profile of a lower region of the transfer gate electrode 130 (TX) may be lowered, and a photocharge in the photodiode 110 (PD) may be transferred to the floating diffusion region 120 (FD). For example, because a dopant concentration difference between regions of the transfer gate electrode 130 (TX) may not be relatively large, a potential barrier having a potential relatively higher than a potential profile of the photodiode 110 (PD) may not be formed. The transfer efficiency of photocharge may be improved, and a photocharge may not remain in the photodiode 110 (PD). In these example embodiments, it may be possible to prevent or reduce an image lag phenomenon in which an incidental image occurs when an image sensor is operated.

Although example embodiments are described herein, it will be apparent to those skilled in the art that various modifications and changes may be made thereto without departing from the scope and spirit of the disclosure and claims. It should be understood that the above example embodiments are not limitative, but merely illustrative.

In an image sensor and an example method of manufacturing the same according to example embodiments, before a transfer gate pattern is formed, a first conductive dopant may be implanted into a gate conductive film to form an image sensor. It may be possible to reduce the difference between a concentration of one conductive dopant in one region of a transfer gate and a concentration of another conductive dopant in another region of a transfer gate pattern.

The potential barrier generated due to a dopant concentration difference between regions of a transfer gate pattern may be reduced in these example embodiments. The transfer efficiency of a photocharge of a photodiode being transferred to a floating diffusion region may be improved, and it is possible to prevent or reduce an image lag phenomenon in which an incidental image occurs when an image sensor operates.

What is claimed is:

1. A method of manufacturing an image sensor, the method comprising:
   forming a gate insulating film and an undoped gate conductive film on a semiconductor substrate;
   doping the gate conductive film with a first-conductive-type dopant;
   forming a transfer gate pattern by patterning the gate insulating film and the gate conductive film after the doping of the gate conductive film;
   forming a first mask that exposes a first section of the transfer gate pattern and a top surface of the semiconductor substrate adjacent to the first region of the transfer gate pattern;
   forming a first-conductive-type photodiode in the semiconductor substrate by implanting the first-conductive-type dopant by using the first mask as an ion implantation mask;
   forming a second-conductive-type photodiode by implanting a second-conductive-type dopant into the exposed first section of the transfer gate pattern and a surface of the first-conductive-type photodiode adjacent to the exposed first section of the transfer gate pattern by using the first mask as an ion implantation mask, the concentration of the second-conductive-type dopant being less than the concentration of the first-conductive-type dopant of the gate conductive film;
   removing the first mask;
   forming a second mask that exposes a second section of the transfer gate pattern and the top surface of the semiconductor substrate adjacent to the second section of the transfer gate pattern; and
   forming a first-conductive-type floating diffusion region in the semiconductor substrate adjacent to the second section of the transfer gate pattern by using the second mask as an ion implantation mask.

2. The method of claim 1, wherein the first-conductive-type is an n-type, and the second-conductive-type is a p-type.

3. The method of claim 1, wherein the doping of the gate conductive film includes implanting the first-conductive-type dopant at a concentration sufficient to invert a dopant implanted into the second-conductive-type photodiode.

4. The method of claim 3, wherein the doping of the gate conductive film includes implanting the first-conductive-type dopant at a concentration of about 1.0E13 to 1.0E14 ions/cm2.

5. The method of claim 1, wherein forming the first-conductive-type photodiode includes implanting the first-conductive-type dopant at a concentration of about 1.0E11 to 1.0E12 ions/cm2.

6. The method of claim 1, wherein forming the second-conductive-type photodiode includes implanting the second-conductive-type dopant at a concentration of about 1.0E11 to 1.0E12 ions/cm2.

7. The method of claim 1, wherein the first-conductive-type floating diffusion region is formed in an LDD structure.

8. The method of claim 1, wherein forming the first-conductive-type floating diffusion region includes implanting the first-conductive-type dopant at first concentration into the second section of the transfer gate pattern and the adjacent top surface of the semiconductor substrate,
   forming spacers on both sides of the transfer gate pattern, and completing the first-conductive-type floating diffusion region by implanting the first-conductive-type dopant at a second concentration higher than the first concentration into the second section of the transfer gate pattern and the top surface of the semiconductor substrate adjacent to the second section of the transfer gate pattern.

9. The method of claim 8, wherein implanting the first-conductive-type dopant at the first concentration includes implanting the first-conductive-type dopant at a concentration of about 1.0E11 to 1.0E12 ions/cm2.

10. The method of claim 8, wherein implanting the first-conductive-type dopant at the second concentration includes implanting the first-conductive-type dopant at a concentration of about 1.0E14 to 1.0E15 ions/cm2.

* * * * *